(12) United States Patent
Nakajima et al.

(10) Patent No.: US 6,803,795 B2
(45) Date of Patent: Oct. 12, 2004

(54) COMPARATOR CIRCUIT

(75) Inventors: Akio Nakajima, Kitakatsuragi-gun (JP); Kohichi Furuta, Nara (JP); Takao Matsui, Kashihara (JP)

(73) Assignee: Sharp Kabushiki Kaisha, Osaka (JP)

( * ) Notice: Subject to any disclaimer, the term of this patent is extended or adjusted under 35 U.S.C. 154(b) by 0 days.

(21) Appl. No.: 10/645,661

(22) Filed: Aug. 22, 2003

(65) Prior Publication Data

US 2004/0046592 A1 Mar. 11, 2004

(30) Foreign Application Priority Data

Aug. 23, 2002 (JP) ........................................ 2002-243270

(51) Int. Cl.[7] .............................................. H03K 5/22
(52) U.S. Cl. ........................... 327/67; 327/65; 327/563; 330/260
(58) Field of Search ............................ 327/63–67, 90, 327/560, 563; 330/260

(56) References Cited

U.S. PATENT DOCUMENTS

| | | | | |
|---|---|---|---|---|
| 5,418,492 A | * | 5/1995 | Wang et al. ................. | 330/260 |
| 6,292,031 B1 | * | 9/2001 | Thompson et al. ........... | 327/67 |
| 6,369,743 B2 | | 4/2002 | Ono ........................... | 341/159 |
| 2001/0007443 A1 | | 7/2001 | Ono ........................... | 341/159 |

FOREIGN PATENT DOCUMENTS

| JP | 2000-188517 A | 7/2000 |
|---|---|---|
| JP | 2001-189633 A | 7/2001 |

\* cited by examiner

*Primary Examiner*—Long Nguyen
(74) *Attorney, Agent, or Firm*—Birch, Stewart, Kolasch & Birch, LLP

(57) ABSTRACT

A comparator circuit includes a differential amplifier including load resistors, for amplifying difference between two input voltages of the comparator circuit; an emitter follower circuit for applying positive feedback with respect to a differential amplifier and outputting an output voltage of the comparator circuit; and a grounded-base amplifier, and outputting an output voltage of the comparator circuit, for realizing both voltage output and current output. A grounded-base amplifier includes two transistors each of which has a base supplied with a reference voltage. The differential amplifier includes two load resistors respectively connected to each emitter of the transistors of the grounded-base amplifier. The load resistor flowing a current which is obtained through a collector of the transistor as an output current of the comparator. With this arrangement, it is not necessary to provide a current switch circuit for obtaining current output of the comparator circuit.

3 Claims, 2 Drawing Sheets and R12.

COMPARATOR CIRCUIT

CROSS-REFERENCE TO RELATED APPLICATION

This application incorporates by reference the subject matter of Application No. 2002-243270 filed in Japan on Aug. 23, 2002, on which a priority claim is based under 35 U.S.C. §119(a).

FIELD OF THE INVENTION

The present invention relates to a comparator circuit, and in particular to a comparator circuit having both current output and voltage output and suitable for a monolithic integrated circuit.

BACKGROUND OF THE INVENTION

A voltage output type comparator is disclosed, for example, in Japanese Laid-Open Patent Application Tokukai 2000-188517A (published on Jul. 4, 2000), or in Japanese Laid-Open Patent Application Tokukai 2001-189633A (published on Jul. 10, 2001). FIG. 2 shows a conventional comparator circuit 11 having both current output and voltage output. The comparator circuit 11 includes a differential amplifier 12, transistors Q13 and Q14, and constant current sources CS12 and CS13. The differential amplifier 12 is made up of transistors Q11 and Q12, resistors R15 and R16, and a constant current source CS11. The comparator circuit 11 further includes an emitter follower circuit 13 as a positive feedback circuit for applying feedback to each base of the transistors Q11 and Q12 of the differential amplifier 12 and for outputting an output voltage of the comparator circuit 11, and means for supplying an input voltage of the comparator circuit 11 to the respective junctions between each base of the transistors Q11 and Q12 of the differential amplifier 12 and resistors R13 and R14 via the resistors R11 and R12.

Also, for obtaining current output, the comparator circuit 11 further includes a current switch circuit 20 made up of the transistors Q15 and Q16, and a constant current source CS14. The output voltage of the comparator 11 is supplied to each base of the transistors Q15 and Q16 so that the collector currents of the transistors Q15 and Q16 are switched with the switching of the output voltage of the comparator circuit 11, thus realizing current output of the comparator circuit 11.

The following will explain operation of the comparator circuit 11 and the current switch circuit 20. Note that, in the operation explained below, hFE of the transistor is so high that the base current does not need to be taken into account. Further, a voltage between base/emitter of the transistor Q13 and a voltage between base/emitter of the transistor Q14 are approximately equal.

In FIG. 2, v1 and v2 express the input voltages of the comparator circuit 11, respectively, while v3 express a base voltage of the transistors Q1, v4 expresses a base voltage of the transistor Q12, v5 expresses an emitter voltage (comparator output voltage) of the transistor Q14, and v6 expresses an emitter voltage (comparator output voltage) of the transistor Q13. Firstly, it is assumed that a current I11 from the constant current source CS11 flows into the transistor Q11 with the input condition=v1>v2. Here, the respective output voltages v5 and v6 are denoted by the following equations.

$$v5 = Vr - VBE(Q14)$$

$$v6 = Vr - R15 \times I11 - VBE(Q13)$$

where Vr expresses a reference voltage, VBE (Q13) expresses the voltage between base/emitter of the transistor Q13. Accordingly, the relation between the comparator output voltages v5 and v6 are expressed as v5>v6.

Further, v3 is supplied by dividing v1 and v5 by the resistors R11 and R13, and v4 is supplied by dividing v2 and v6 by the resistors R12 and R14. Thus, v3 and v4 are denoted by the following equations.

$$v3 = (R11 \times v5 + R13 \times v1)/(R11 + R13)$$

$$v4 = (R12 \times v6 + R14 \times v2)/(R12 + R14)$$

According to the relations v1>v2 and v5>v6, and when the resistors are designed to satisfy R11=R12 and R13=R14, v3 becomes greater than v4. Therefore, the constant current I11 of the constant current source CS11 flows into the transistor Q11, and the output voltages of the comparator circuit 11 stably maintain the relation of v5>v6.

Further, according to the relation of v5>v6, the constant current I14 flows into the transistor Q15 in a current switch circuit 20 as the second-stage circuit, and the output current of the comparator becomes io1=I14, io2=0. Thus, the output currents also stably maintain the relation of io1>io2.

Next, in the condition above, when v1 is decreased with respect to v2 (v1<v2), the difference between v3 and v4 is reduced, and when the difference between v3 and v4 satisfies a certain condition with the application of positive feedback by the resistors R13 and 14, the flow of the constant current I11 is switched from the transistor Q11 to the transistor Q12. This switching is carried out on condition that the open loop gain=1 when the positive feedback loop is removed. According to this condition, the relation between v3 and v4 can be denoted as follows.

$$v3 - v4 = VT \times \ln((I11/2 + \sqrt{A})/(I11/2 - \sqrt{A}))$$

where $$A = I11 \times (I11/4 - VT/R), R = R11 \times R16/(R11 + R13) + R12 \times R15/(R12 + R14), VT = K \times T/q.$$

(K expresses Boltzmann's constant, T expresses absolute temperature, q expresses elementary charge)

When the difference between v3 and v4 satisfies the foregoing equation, the operation of the comparator circuit 11 is instantly reversed by the positive feedback circuit, and the constant current I11 flows into the transistor Q12. Here, the output voltages of the comparator are expressed as follows.

$$v5 = Vr - I11 \times R16 - VBE(Q14)$$

$$v6 = Vr - VBE(Q13)$$

Accordingly, the relation between the comparator output voltages v5 and v6 are denoted as v5<v6.

Further, as with the case above, the relation between v3 and v4 are expressed by the following equations.

$$v3 = (R11 \times v5 + R13 \times v1)/(R11 + R13)$$

$$v4 = (R12 \times v6 + R14 \times v2)/(R12 + R14)$$

According to the relations v1<v2 and v5<v6, and when the resistors are designed to satisfy R11=R12 and R13=R14, v4 becomes greater than v3, and therefore, the constant current I11 flows into the transistor Q12, and the output voltages of the comparator circuit 11 stably maintain the relation of v5<v6. Here, since the constant current I14 flows into the transistor Q16 in the current switch circuit 20 as the second-stage circuit, the output currents of the comparator become io1=0, io2=i4. Accordingly, the relation of io1<io2 is maintained.

Next, in the condition above, when v1 is decreased with respect to v2 (v1<v2), the operation of the comparator 11 is reversed when the difference between v3 and v4 satisfies a certain condition. As with the case above, the open loop gain=1 also in this condition, and the following equation is satisfied.

$$v3-v4=VT \times \ln((I11/2+\sqrt{A})/(I11/2-\sqrt{A}))$$

When the difference between v3 and v4 satisfies the foregoing equation with the application of positive feedback, the operation of the comparator circuit 11 is instantly reversed, and the constant current I11 flows in the transistor Q11, i.e., the current flow is again in the original state.

In order to realize both voltage output and current output in the comparator circuit 11, it is necessary to additionally provide the current switch circuit 20. In, this configuration, the circuit current increases, and provision of the current switch circuit increases the chip size.

SUMMARY OF THE INVENTION

An object of the present invention is to provide a comparator circuit with a simpler structure, and a smaller circuit area when realized as an IC, and less circuit current. In order to solve the foregoing problems, a comparator circuit according to the present invention includes: a differential amplifier including load resistors, for amplifying difference between two input voltages of the comparator circuit; an emitter follower circuit for applying positive feedback with respect to the differential amplifier, and outputting an output voltage of the comparator circuit; a grounded-base amplifier having transistors which each includes a base supplied with a reference voltage. The load resistors respectively flow currents which are obtained through the transistors as output currents of the comparator circuit.

With the foregoing arrangement, the operation of the comparator circuit also carries out switching operation so that a current flowing in one transistor of a pair of differential transistors constituting a differential amplifier flows in another transistor of the pair. With this operation, the comparator circuit realizes current output by obtaining the current flowing in the load resistor of the differential amplifier through a transistor of a grounded-base amplifier as an output current of the comparator. With this arrangement, a conventional current switch circuit is not Additional objects, features, and strengths of the present invention will be made clear by the description below. Further, the advantages of the present invention will be evident from the following explanation in reference to the drawings.

DESCRIPTION OF THE EMBODIMENTS

Figure 1:
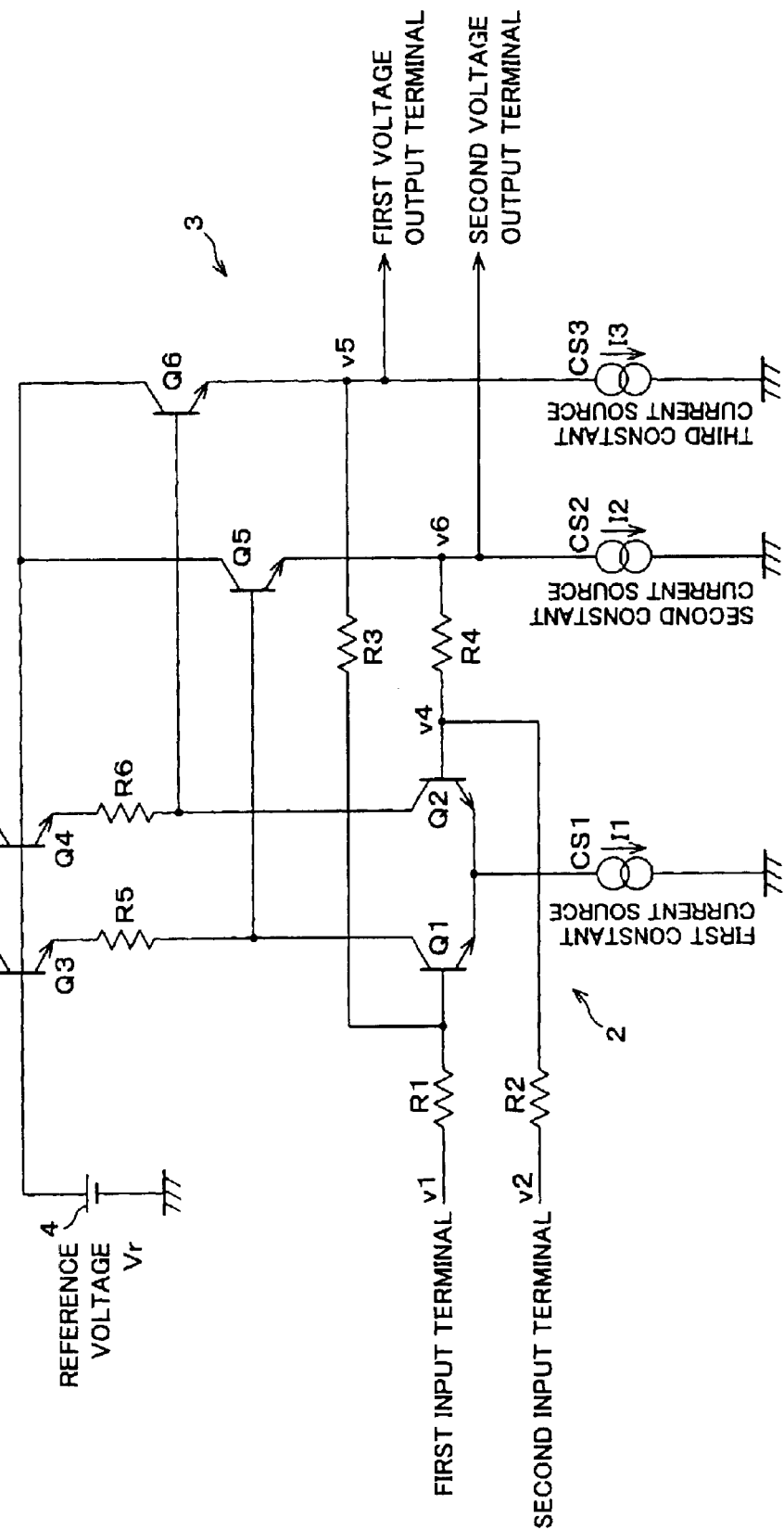
FIG. 1 is a circuit diagram showing a comparator circuit according to one embodiment of the present invention.

FIG. 1 shows a comparator circuit according to one embodiment of the present invention. This comparator circuit 1 includes a differential amplifier 2 and an emitter follower circuit 3 as its main configuration, but does not include a circuit corresponding to the current switch circuit 20 shown in FIG. 2. The differential amplifier 2 amplifies the difference between two input voltages of the comparator circuit 1. The differential amplifier 2 includes load resistors R5 and R6, transistors Q1 and Q2, a constant current source CS1, as with the differential amplifier 12 of FIG. 2; and additionally includes transistors Q3 and Q4 as a grounded-base amplifier in which a base potential is used as a reference voltage. The reference voltage is generated in a reference voltage source 4. The transistors Q3 and Q4 are serially connected to the load resistors R5 and R6, respectively. More specifically, each emitter of the transistors Q3 and Q4 are respectively connected to the load resistors R5 and R6, and the comparator current outputs are obtained from the respective collectors of the transistors Q3 and Q4.

Figure 2:
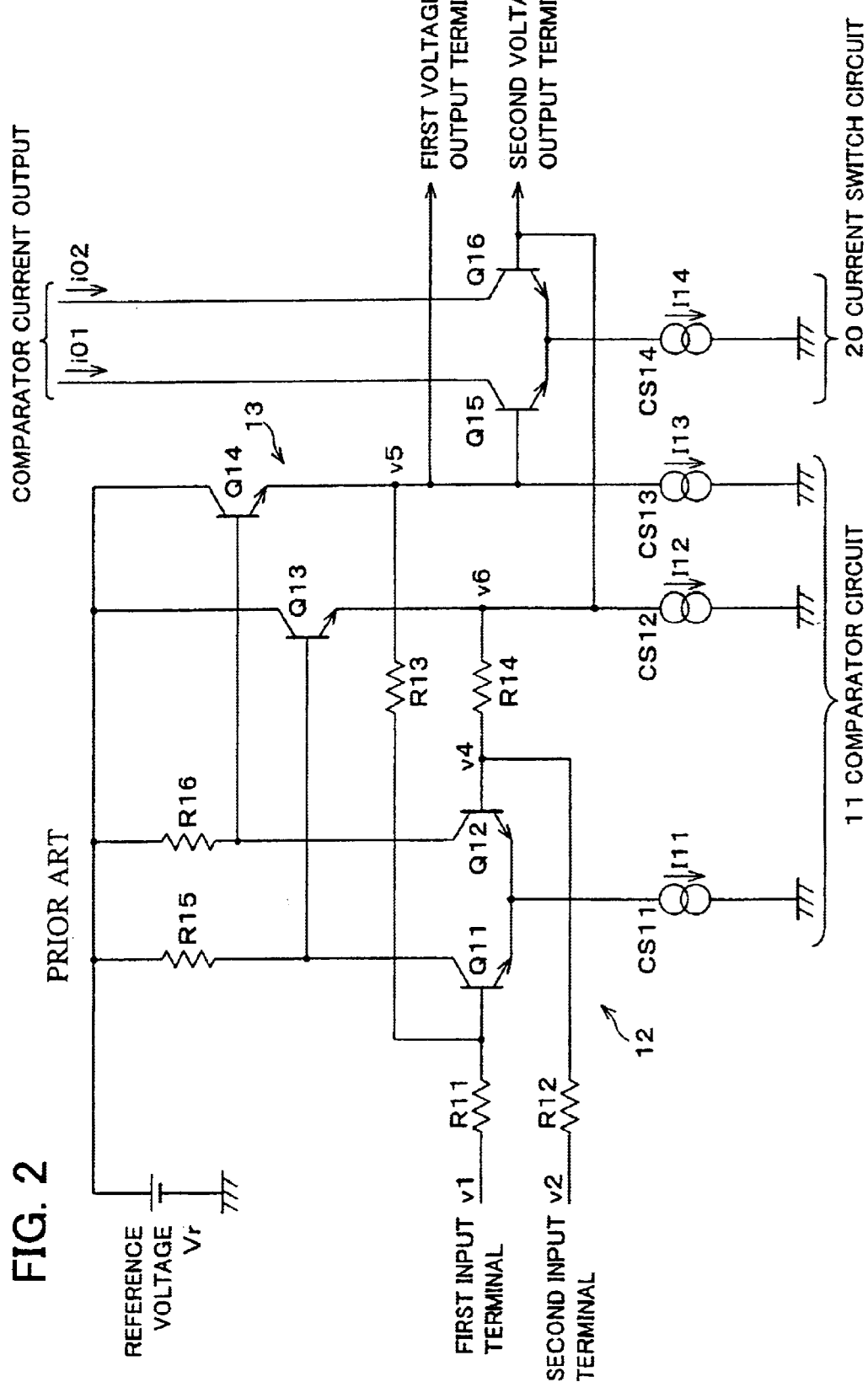
FIG. 2 is a circuit diagram showing a conventional comparator circuit.

As with the emitter follower circuit 13 of FIG. 2, the emitter follower circuit 3 includes transistors Q5 and Q6, and constant current source CS2 and CS3. The emitter follower circuit 3 operates as a positive feedback circuit for supplying the output of the differential amplifier 2 to each base of the transistors Q1 and Q2 via feedback resistors R3 and R4, and also operates as an emitter follower circuit for outputting an output voltage of the comparator circuit 11. Further, input voltages v1 and v2 are respectively supplied from first and second input terminals to the comparator circuit 1. Then, the input voltages v1 and v2 are supplied as base voltages v3 and v4 to the respective junction between each base of the transistors Q1 and Q2 of the differential amplifier 2 and the resistors R3 or R4 via the resistors R1 and R2.

Next, the following will explain operation of the comparator circuit 1 of the present embodiment.

Note that, in the following explanation, hFE of the transistor is so high that the base current does not need to be taken into account. Further, a voltage VBE (Q4) between base/emitter of the transistor Q4 and a voltage VBE (Q3) between base/emitter of the transistor Q3 are approximately equal, and a voltage VBE (Q5) between base/emitter of the transistor Q5 and a voltage VBE (Q6) between base/emitter of the transistor Q6 are approximately equal.

The input voltages of the comparator circuit 1 are expressed as v1 and v2 as shown in FIG. 1, the base voltages of the transistors Q1 and Q2 are respectively expressed as v3 and v4, and the emitter voltage (comparator output) of the transistor Q5 is expressed as v6, and the emitter voltage of the transistor Q6 is expressed as v5. Firstly, it is assumed that the constant current I1 flows into the transistor Q1 side on condition that v1>v2. Here, the respective output voltages are denoted by the following equations.

$$v5=Vr-VBE(Q4)-VBE(6)$$

$$v6=Vr-R5 \times I11-VBE(Q3)-VBE(Q5)$$

Accordingly, the relation between the output voltages v5 and v6 of the comparator circuit 1 is denoted as v5>v6.

Further, v3 is supplied by dividing v1 and v5 by the resistors R1 and R3, and v4 is supplied by dividing v2 and v6 by the resistors R2 and R4. Accordingly, v3 and v4 are denoted by the following equations.

$$v3=(R1 \times v5+R3 \times v1)/(R1+R3)$$

$$v4=(R2 \times v6+R4 \times v2)/(R2+R4)$$

According to the equations v1>v2 and v5>v6, and when resistors are designed to satisfy R1=R2 and R3=R4, v3 becomes greater than v4. Therefore, the constant current I1 flows into the transistor Q1 side, and the output voltages of the comparator circuit 1 stably maintain the relation of v5>v6.

Further, as to the current output, since the constant current I1 flows in the transistor Q1 side, the output currents of the comparator are expressed as io1=I1, io2=0. Accordingly, the relation of io1>io2 is stably maintained.

Next, in the condition above, when v1 is decreased with respect to v2 (v1<v2), the difference between v3 and v4 is reduced, and when the difference between v3 and v4 satisfies a certain condition with the application of positive feedback by the resistors R3 and 4, the flow of the constant current I1 is switched from the transistor Q1 to the transistor Q2. This switching is carried out on condition that the open loop gain=1 when the positive feedback loop is removed. According to this condition, the difference between v3 and v4 can be denoted as follows.

$$v3-v4=VT \times \ln((I1/2+\sqrt{A})/(I1/2-\sqrt{A}))$$

where $$A=I1\times(I1/4=VT/R), R=R1\times R6/(R1+R3)+R2\times R5/(R2+R4), VT=K\times T/q.$$

(K expresses Boltzmann's constant, T expresses absolute temperature, q expresses elementary charge)

When the difference between v3 and v4 satisfies the foregoing equation, the operation of the comparator is instantly reversed by the positive feedback circuit, and the constant current I1 flows into the transistor Q2. Here, the respective voltages are expressed as follows.

$$v5=Vr-I1\times R6-VBE(Q4)-VBE(6)$$

$$v6=Vr-VBE(Q3)-VBE(Q5)$$

Accordingly, the relation between the comparator output voltages v5 and v6 is denoted as v5<v6.

Further, as with the case above, the relation between v3 and v4 is expressed by the following equations.

$$v3=(R1\times v5+R3\times v1)/(R1+R3)$$

$$v4=(R2\times v6+R4\times v2)/(R2+R4)$$

According to the relations v1<v2 and v5<v6, v4 becomes greater than v3, and therefore, the constant current I1 flows into the transistor Q2, and the output voltages of the comparator circuit 1 stably maintain the relation of v5<v6.

Further, since the constant current I1 flows into the transistor Q2, the output current of the comparator are denoted by io1=0, io2=I1. Accordingly, the relation of io1<io2 is maintained.

Next, in the condition above, v1 is increased with respect to v2 (v1>v2), and when the difference between v3 and v4 satisfies a certain condition, the operation of the comparator is reversed. As with the case above, the open loop gain=1 also in this condition, and the following equation is satisfied.

$$v3-v4=VT\times\ln((I11/2+\sqrt{A})/(I11/2-\sqrt{A}))$$

When the difference between v3 and v4 satisfies the foregoing equation, the operation of the comparator is instantly reversed by the positive feedback circuit, and the constant current I1 flows into the transistor Q1, i.e., the current flow is again in the original state.

As has been described, the comparator circuit of the present embodiment includes a differential amplifier for inputting an input voltage of the comparator circuit and an emitter follower circuit for supplying back the output of the differential amplifier to apply positive feedback thereto, and outputting an output voltage of the comparator circuit, wherein the differential amplifier includes a load resistor that is connected to an emitter of a transistor constituting a grounded-base amplifier whose base is connected to a reference voltage, and the load resistor flowing a current which is obtained through a collector of the transistor as an output current of the comparator.

Further, more specifically, the comparator circuit of the present embodiment includes: first and second transistors whose emitters are both connected to a first constant current source and whose collectors are connected to one terminal of a fifth resistor and one terminal of a sixth resistor, respectively, so as to constitute a differential amplifier; third and fourth transistors for constituting a grounded-base amplifier, the third and fourth transistors having emitters connected to another terminal of the fifth resistor and another terminal of the sixth resistor, respectively, the third and fourth transistors each including a base connected to a reference voltage source so that currents flowing in the first and second resistors are obtained through each collector of the third and fourth transistors as first and second output currents of the comparator circuit; fifth and sixth transistors which operate as a follower circuit for outputting first and second output voltages by using outputs of the differential amplifier; second and third constant current sources for supplying a constant current to each of the fifth and sixth transistors, respectively; first and third resistors connected in series between a first input terminal and a first voltage output terminal, the first and third resistors having a junction therebetween which is connected to a base of the first transistor; and second and fourth resistors connected in series between a second input terminal and a second voltage output terminal, the second and fourth resistors having a junction therebetween, which is connected to a base of the second transistor.

With this arrangement, the operation current of the differential amplifier is obtained as an output current of the comparator circuit, and therefore, a conventional current switch circuit is not required, thus reducing amount of circuit current. Further, since this arrangement does not require a transistor and a constant current circuit for the current switch circuit, the number of elements is reduced, thus reducing the chip size when the arrangement is realized as an IC.

The embodiments and concrete examples of implementation discussed in the foregoing detailed explanation serve solely to illustrate the technical details of the present invention, which should not be narrowly interpreted within the limits of such embodiments and concrete examples, but rather may be applied in many variations within the spirit of the present invention, provided such variations do not exceed the scope of the patent claims set forth below.

What is claimed is:

1. A comparator circuit, comprising:
    a differential amplifier including load resistors, for amplifying difference between two input voltages of the comparator circuit;
    an emitter follower circuit for applying positive feedback with respect to the differential amplifier, and outputting an output voltage of the comparator circuit;
    a grounded-base amplifier having transistors which each includes a base supplied with a reference voltage,
    the load resistors respectively flowing currents which are obtained through the transistors as output currents of the comparator circuit.

2. The comparator circuit as set forth in claim 1, wherein:

the load resistors are respectively connected to each emitter of the transistors, and the load resistors respectively flow currents which are obtained through each collector of the transistors as output currents of the comparator circuit.

3. A comparator circuit, comprising:

first and second transistors whose emitters are both connected to a first constant current source and whose collectors are connected to one terminal of a first resistor and one terminal of a second resistor, respectively, so as to constitute a differential amplifier;

third and fourth transistors for constituting a grounded-base amplifier, the third and fourth transistors having emitters connected to another terminal of the first resistor and another terminal of the second resistor, respectively, the third and fourth transistors each including a base connected to a reference voltage source so that currents flowing in the first and second resistors are obtained through each collector of the third and fourth transistors as first and second output currents of the comparator circuit;

fifth and sixth transistors which operate as a follower circuit for outputting first and second output voltages by using outputs of the differential amplifier;

second and third constant current sources for supplying a constant current to each of the fifth and sixth transistors, respectively;

third and fourth resistors connected in series between a first input terminal and a first voltage output terminal, the third and fourth resistors having a junction therebetween, which is connected to a base of the first transistor; and fifth and sixth resistors connected in series between a second input terminal and a second voltage output terminal, the fifth and sixth resistors having a junction therebetween, which is connected to a base of the second transistor.

* * * * *